US012805055B2

(12) United States Patent
Scherrer et al.

(10) Patent No.: US 12,805,055 B2
(45) Date of Patent: Nov. 17, 2026

(54) FABRICATION OF A SEMICONDUCTOR DEVICE INCLUDING A QUANTUM DOT STRUCTURE

(71) Applicant: INTERNATIONAL BUSINESS MACHINES CORPORATION, Armonk, NY (US)

(72) Inventors: Markus Scherrer, Zurich (CH); Kirsten Emilie Moselund, Ruschlikon (CH); Preksha Tiwari, Zurich (CH); Noelia Vico Trivino, Zurich (CH)

(73) Assignee: International Business Machines Corporation, Armonk, NY (US)

(*) Notice: Subject to any disclaimer, the term of this patent is extended or adjusted under 35 U.S.C. 154(b) by 482 days.

(21) Appl. No.: 18/341,795

(22) Filed: Jun. 27, 2023

(65) Prior Publication Data

US 2025/0151450 A1 May 8, 2025

Related U.S. Application Data

(62) Division of application No. 17/454,830, filed on Nov. 15, 2021, now Pat. No. 11,728,448.

(51) Int. Cl.

*H10F 77/14* (2025.01)
*H10P 14/20* (2026.01)

(52) U.S. Cl.

CPC ....... *H10F 77/1433* (2025.01); *H10P 14/274* (2026.01); *H10P 14/2905* (2026.01); *H10P 14/3251* (2026.01)

(58) Field of Classification Search

CPC ........... H10F 77/1433; H01L 21/02381; H01L 21/02505; H01L 21/02645;

(Continued)

(56) References Cited

U.S. PATENT DOCUMENTS 6,074,936 A 6/2000 Ro
6,534,782 B1 3/2003 Liang (Continued)

FOREIGN PATENT DOCUMENTS

CN 111181006 A 5/2020
JP 2007-251089 A 9/2007

(Continued)

OTHER PUBLICATIONS

IBM: List of IBM Patents or Patent Applications Treated as Related (Appendix P), Jun. 28, 2023, 2 pages.

(Continued)

*Primary Examiner* — Dale E Page
*Assistant Examiner* — Quovaunda Jefferson
(74) *Attorney, Agent, or Firm* — Harrity & Harrity, LLP

(57) ABSTRACT

The invention relates to a method for fabricating a semiconductor device. The method includes steps of providing a cavity structure, the cavity structure including a seed area including a seed material. The method further includes growing, within the cavity structure, a first embedding layer in a first growth direction from a seed surface of the seed material. The method includes further steps of removing the seed material, growing, in a second growth direction, from a seed surface of the first embedding layer, a quantum dot structure and growing, within the cavity structure, on a surface of the quantum dot structure, a second embedding layer in the second growth direction. The second growth direction is different from the first growth direction. The invention further relates to devices obtainable by such a method.

18 Claims, 5 Drawing Sheets

(58) Field of Classification Search
CPC ........... H01L 21/02488; H01L 21/0259; H01L 21/02639; H01L 21/02538; B82Y 10/00; B82Y 20/00; B82Y 40/00
See application file for complete search history.

(56) References Cited

U.S. PATENT DOCUMENTS

| | | | | |
|---|---|---|---|---|
| 6,600,169 | B2 * | 7/2003 | Stintz | B82Y 10/00 257/17 |
| 7,244,679 | B2 | 7/2007 | Koh | |
| 8,183,073 | B2 | 5/2012 | Arakawa | |
| 8,288,754 | B2 | 10/2012 | Bidal | |
| 8,809,093 | B2 | 8/2014 | Homyk | |
| 9,117,763 | B1 | 8/2015 | Chen | |
| 9,239,424 | B2 | 1/2016 | Czornomaz | |
| 9,620,360 | B1 | 4/2017 | Borg | |
| 11,616,344 | B2 | 3/2023 | Vico Trivino | |
| 2002/0079485 | A1 | 6/2002 | Stintz | |
| 2007/0262292 | A1 * | 11/2007 | Matsukura | B82Y 20/00 257/E31.032 |
| 2009/0045394 | A1 * | 2/2009 | Smeeton | H10D 62/814 438/94 |
| 2010/0123120 | A1 | 5/2010 | Mohseni | |
| 2011/0263108 | A1 | 10/2011 | Lan | |
| 2011/0277829 | A1 | 11/2011 | Fafard et al. | |
| 2012/0267603 | A1 | 10/2012 | Lee | |
| 2015/0212266 | A1 * | 7/2015 | Czornomaz | G02B 6/1225 438/31 |
| 2018/0108804 | A1 | 4/2018 | Ellis | |
| 2018/0331240 | A1 | 11/2018 | Yoshikawa | |
| 2020/0321214 | A1 | 10/2020 | Mauthe et al. | |
| 2021/0246571 | A1 | 8/2021 | Cardwell | |
| 2021/0328406 | A1 | 10/2021 | Noda | |
| 2023/0155044 | A1 * | 5/2023 | Scherrer | H10F 77/1433 257/14 |
| 2023/0170428 | A1 | 6/2023 | Emilie | |

FOREIGN PATENT DOCUMENTS

| | | | |
|---|---|---|---|
| WO | 2019227035 | A1 | 11/2019 |
| WO | 2023084414 | A1 | 5/2023 |
| WO | 2023084415 | A1 | 5/2023 |

OTHER PUBLICATIONS

Akahane et al., "Fabrication of III-V semiconductor quantum dots", Article in Proceedings of SPIE—The International Society for Optical Engineering · Aug. 2009, 11 pages.
Claudon et al., "A highly efficient single-photon source based on a quantum dot in a photonic nanowire", Nature Photonics, Letters, Published Online 31, Jan. 2010, pp. 174-177.
Folsch et al., "Quantum dots with single-atom precision", nature nanotechnology, Letters, Nature Nanotechnology, vol. 9, Jul. 2014, 5 pages.
Gazzano et al., "Bright solid-state sources of indistinguishable single photons", Nature Communications, Published Feb. 5, 2013, 6 pages.
IBM: List of IBM Patents or Patent Applications Treated as Related (Appendix P), Nov. 15, 2021, 2 pages.
Loredo et al., "Scalable performance in solid-state single-photon sources", Research Article, optica, vol. 3, No. 4, Apr. 2016, pp. 433-440.
Luxmoore et al., "III-V quantum light source and cavity-QED on Silicon", Scientific Reports, Published Feb. 7, 2013, 5 pages.
Mantynen et al., "Single-photon sources with quantum dots in III-V nanowires", Review Article, Nanophotonics 2019; 8(5), Received Jan. 8, 2019; revised Mar. 7, 2019; accepted Mar. 7, 2019, pp. 747-769.
Mauthe et al., "High-speed III-V nanowire photodetector monolithically integrated on Si", nature Communications, 2020, pp. 1-7.
Mauthe et. al, "Hybrid III-V Silicon Photonic Crystal Cavity Emitting at Telecom Wavelengths", Publication Date: Nov. 20, 2020, 3 pages.
Notification of Transmittal of the International Search Report and the Written Opinion of the International Searching Authority, or the Declaration, Date of mailing Feb. 21, 2023, International application No. PCT/IB2022/060792, 13 pages.
Notification of Transmittal of the International Search Report and the Written Opinion of the International Searching Authority, or the Declaration, Date of mailing Feb. 21, 2023, International application No. PCT/IB2022/060793, 11 pages.
Reimer et al., "Bright single-photon sources in bottom-up tailored nanowires", Nature Communications, Published Mar. 13, 2012, 6 pages.
Schmid et al., "Template-assisted selective epitaxy of III-V nanoscale devices for co-planar heterogeneous integration with Si", Applied Physics Letters 106, 233101, 2015, 5 pages.
Senellart et al., "High-performance semiconductor quantum-dot single-photon sources", Nature Nanotechnology, vol. 12, Nov. 2017, pp. 1026-1039.
Shan et al., "Single photon sources with single semiconductor quantum dots", Frontiers of Physics, 2014, 9(2), Review Article, pp. 170-193.
Srocka et al., "Deterministically fabricated quantum dot single-photon source emitting indistinguishable photons in the telecom O-band", Applied Physics Letters, Appl. Phys. Lett. 116, 231104 (2020); doi: 10.1063/5.0010436, Published Online: Jun. 9, 2020, 6 pages.
Xie et al., "On-Chip Integrated Quantum-Dot-Silicon-Nitride Microdisk Lasers", Sep. 2016, 15 pages.
Yu et al., "III-V lasers selectively grown on (001) silicon", Journal of Applied Physics, Published Online: Nov. 24, 2020, 15 pages.
Zadeh et al., "Deterministic Integration of Single Photon Sources in Silicon Based Photonic Circuits", Nano Letters, Published Mar. 8, 2016, pp. 2289-2294.
Baumgartner et al., "High-speed CMOS-compatible III-V on Si membrane photodetectors", Optics Express, vol. 29, No. 1, Jan. 4, 2021, 8 pages.
Japan Patent Office, "Notice of Reasons for Refusal" Jun. 16, 2026, 08 Pages, JP Application No. 2024-528607.

* cited by examiner

Si
SiO2
QD material
embedding
embedding
y
x
122
101 y
x
123
122
102 y
x
124
123
122
126
103 y
x
123
122
126
104 y
x
122
127
126
105

Si
SiO2
QD material
embedding
embedding
128
y
x
128a
129
106

130
140
107

130
132
108

128
137
130
132
128b
131
109

160
150
130
141
132
151
126
110

FABRICATION OF A SEMICONDUCTOR DEVICE INCLUDING A QUANTUM DOT STRUCTURE

BACKGROUND

Embodiments of the invention relate generally to a method for fabricating a semiconductor device including a quantum dot structure. Embodiments of the invention further relate to a device obtainable by such a method.

Integrated quantum optics has attracted high interest for optical quantum computing. First proof of principle demonstrations have proven qubit operations using photons.

Key devices for optical computing are single photon sources and single photon detectors. While first devices have been demonstrated, a scalable and highly controlled process is needed. Whereas single photon detectors based on superconducting nanowire technology are well established, there is a rising interest in scaled devices which can operate at a higher than normal temperature, for example and in particular at room temperature.

Single photon devices are often based on materials with a single quantum dot incorporated. The precise alignment of the quantum dot is crucial to achieve efficient single photon operation and allow for the fabrication of more advanced devices. Hence there is a need for a fabrication approach that enables a precise fabrication of quantum dot structures in semiconductor material systems.

Quantum dots are semiconductor particles made on a nanoscale which can transport electrons. Quantum dots have electrical and optical properties which differ than larger particles due to quantum mechanics.

SUMMARY

According to an aspect, the invention is embodied as method for fabricating a semiconductor device. The method includes steps of providing a cavity structure, the cavity structure including a seed area including a seed material. The method further includes growing, within the cavity structure, a first embedding layer in a first growth direction from a seed surface of the seed material. The method includes further steps of removing the seed material, growing, in a second growth direction, from a seed surface of the first embedding layer, a quantum dot structure and growing, within the cavity structure, on a surface of the quantum dot structure, a second embedding layer in the second growth direction. The second growth direction is different from the first growth direction.

According to an embodiment of a further aspect of the invention, a semiconductor device obtainable by a method according to the first aspect is provided.

According to an embodiment of a further aspect of the invention, a semiconductor device is provided which includes a quantum dot structure. The quantum dot structure is arranged between a first embedding layer and a second embedding layer. The quantum dot structure has been epitaxially grown from a seed surface of the first embedding layer. Furthermore, the second embedding layer has been epitaxially grown on a surface of the quantum dot structure. The surface of the quantum dot structure and the seed surface of the first embedding layer are arranged at opposite sides of the quantum dot structure.

According to an embodiment of a further aspect of the invention, the proposed semiconductor structure may be placed within a resonant structure, such as a photonic crystal lattice, to provide enhanced emission in a resonant mode.

According to an embodiment of a further aspect of the invention, the proposed semiconductor structure may be configured with respect to waveguides and other passive structures to allow for ease of in or out coupling of light.

The steps of the method aspect of the invention may be performed in different orders as appropriate. Importantly, the growth of a quantum dot (QD) may happen in the step immediately before the growth of the second embedding layer. This may reduce the impact of lattice mismatch from the seed layer.

Furthermore, the steps may also be combined as appropriate, i.e. that e.g. two or more steps may be performed together.

Advantages of the features of one aspect of the invention may apply to corresponding features of another aspect of the invention.

Embodiments of the invention will be described in more detail below, by way of illustrative and non-limiting examples, with reference to the accompanying drawings.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 2A:
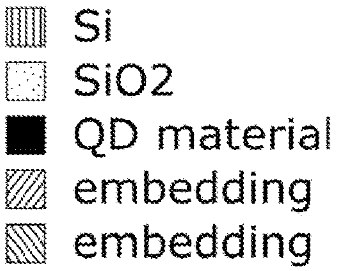
FIGS. 2*a*-2*j* show corresponding enlarged cross-sectional views of the structures corresponding to the FIGS. 1*a*-1*j*.
Figure 2A:
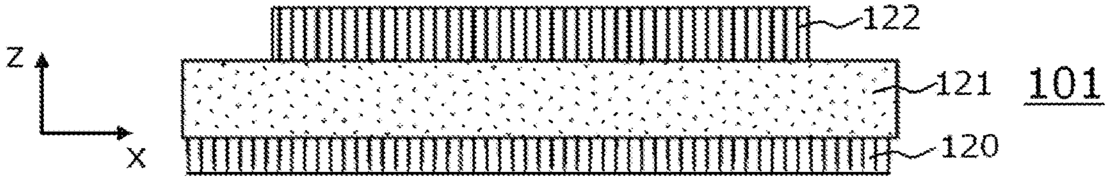
Figure 2B:
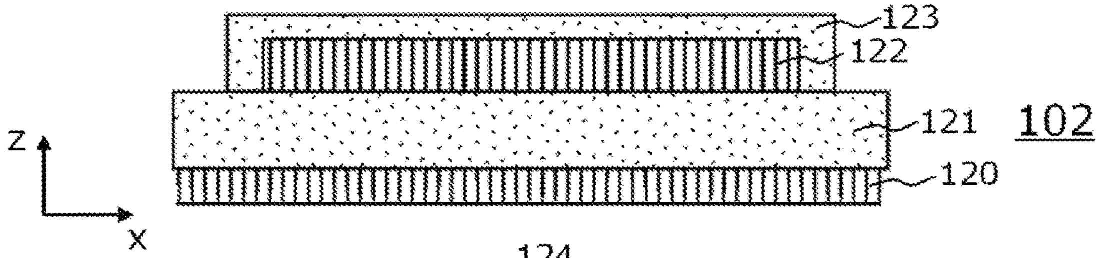
Figure 2C:
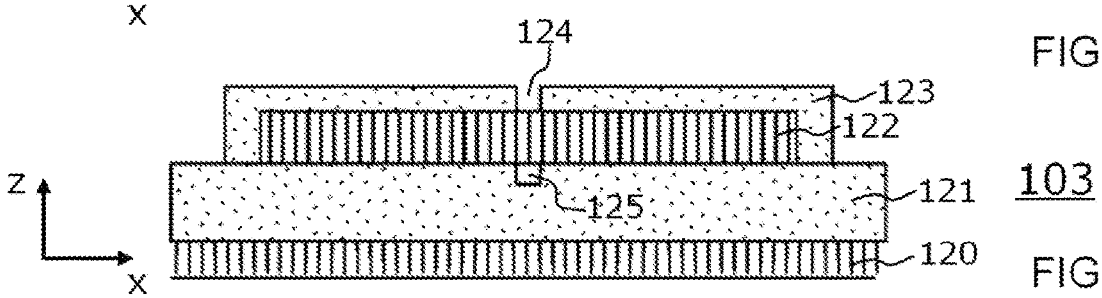
Figure 2D:
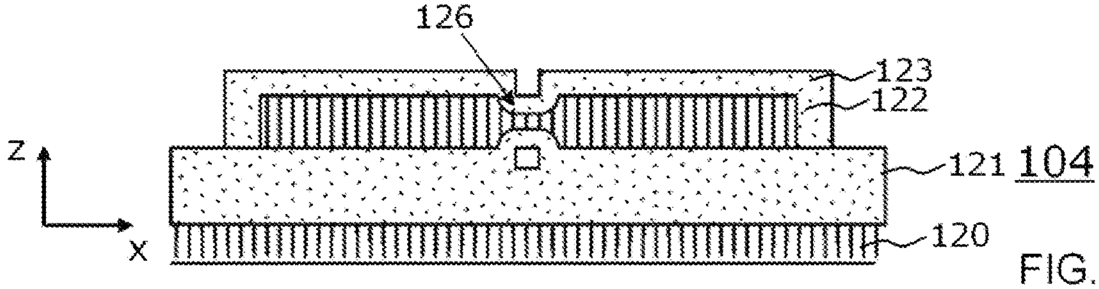
Figure 2E:
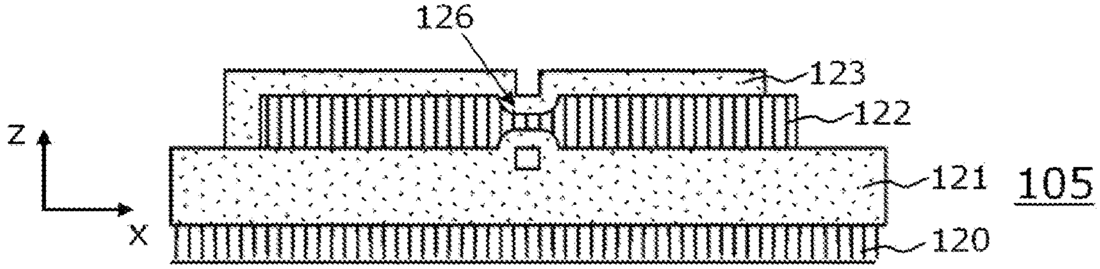
Figures 2F, 2G, 2H, 2I, 2J:
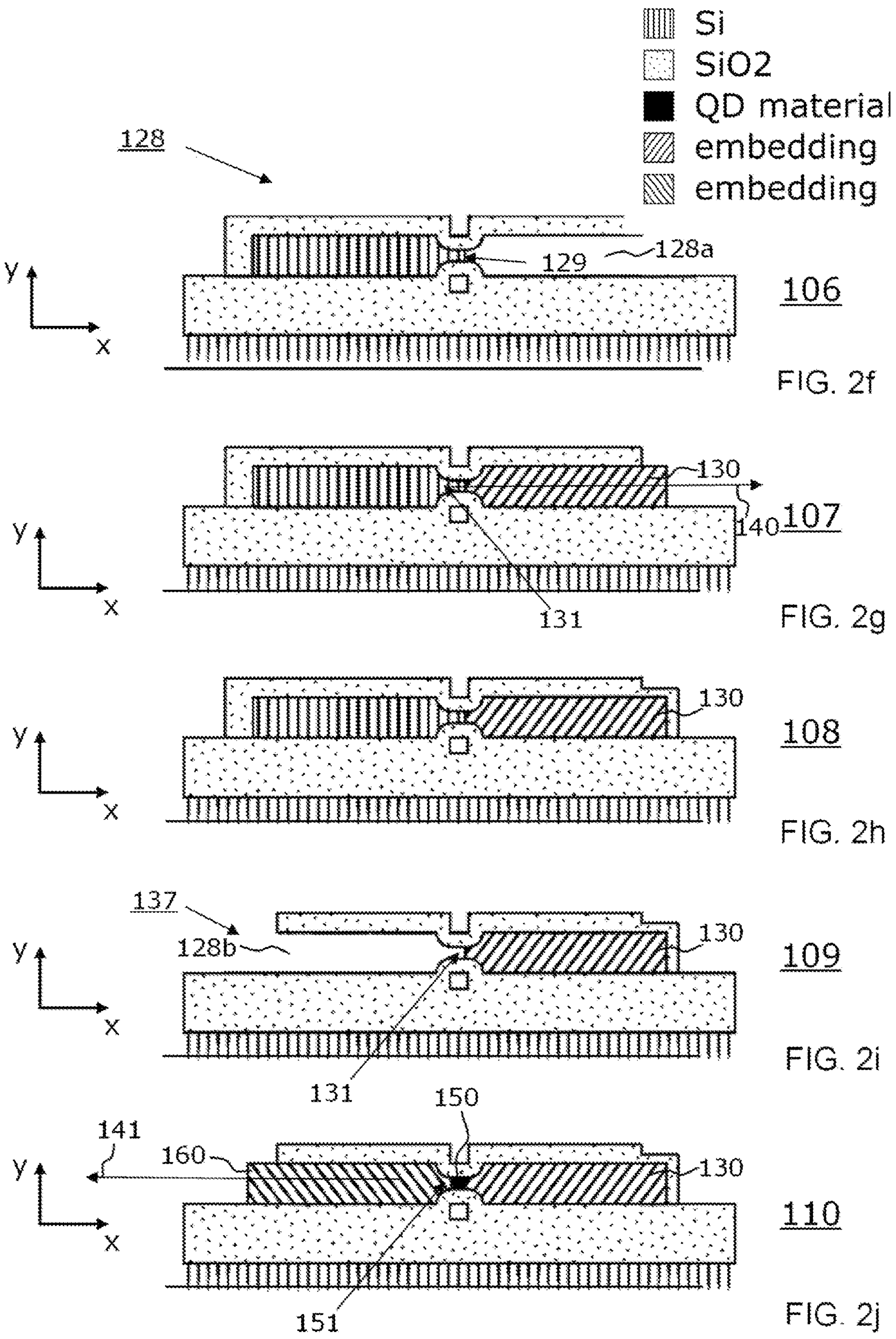
Figure 3:
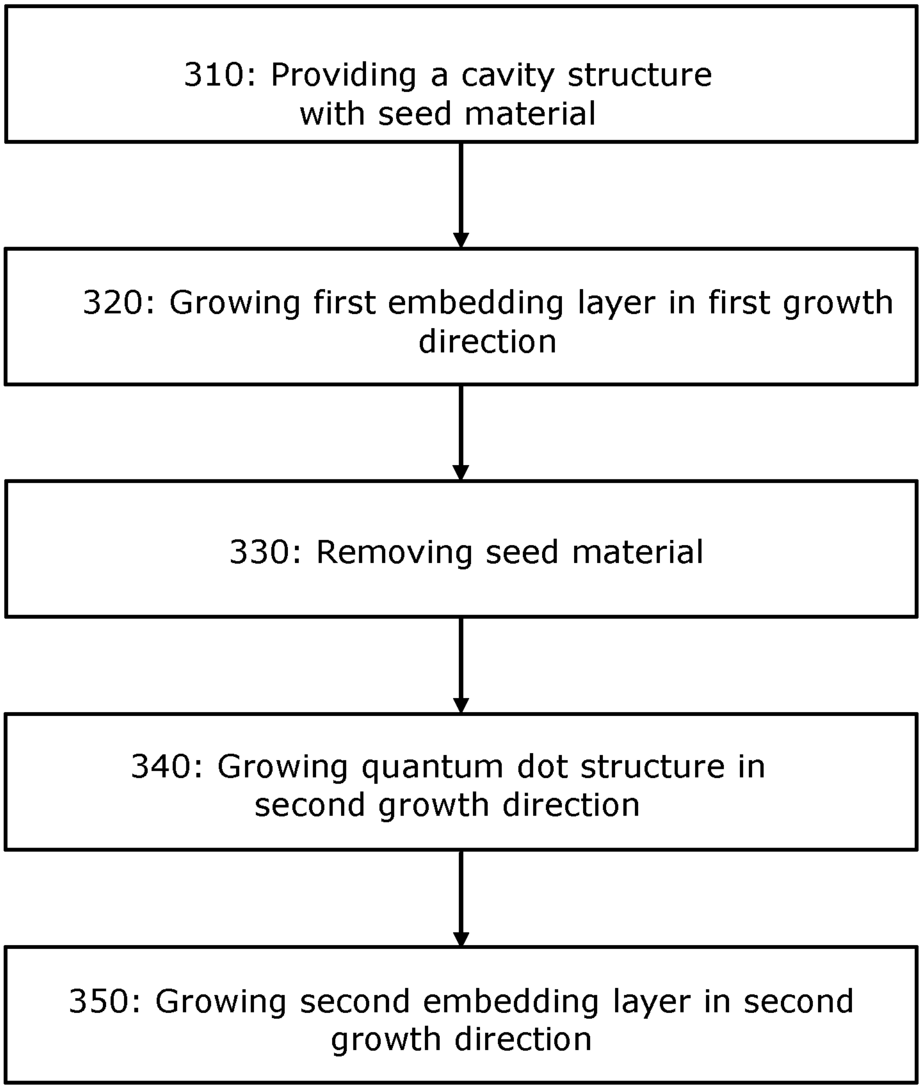
FIG. 3 shows a flow chart of method steps of a method for fabricating a semiconductor structure according to embodiments of the invention.

At first, in reference to FIGS. 1-3, some general aspects and terms of embodiments of the invention are described.

In any or all of the figures the dimensions may not be drawn to scale and may be shown in a simplified and schematic way to illustrate the features and principles of embodiments of the invention.

The term "cavity" here refers to a hollow space covered by a template into which the quantum dot (QD) and embedding layers may be grown. It is not to be confused with a resonant cavity used to fabricate a laser or other resonant device, although the "cavity" might be integrated into such a resonant structure.

The term "on" and "above" are used in this context, as is customary, to indicate orientation or relative position in a vertical or orthogonal direction to the surface of the substrate, in particular in a vertical z-direction.

The terms "lateral" or "laterally" are used in this context, as is customary, to indicate orientation generally parallel to the plane of the substrate, as opposed to generally vertically, or outwardly, from the substrate surface.

The term "arranged on a/the semiconductor substrate" shall be understood in a broad sense and shall include in particular embodiments according to which an intermediate layer, e.g. an insulating layer, is arranged between the substrate and the photonic crystal structure. Hence the term “arranged on the substrate” shall include the meaning arranged “above the substrate”.

Methods according to embodiments of the invention allow to fabricate quantum dot structures, in particular a localized quantum dot, within an integrated active semiconductor device, in particular on silicon or silicon-on-insulator (SOI).

Embodiments of the invention perform a two-step epitaxial growth process within a cavity structure. By means of the two-step growth process a first and a second embedding layer of embedding materials can be grown on opposite sides of the quantum dot structure. This allows for precise positioning of the quantum dot structure within the embedding materials. The embedding materials may be in particular semiconductor materials, in particular group III-V semiconductor materials.

According to embodiments, the growth of the quantum dot structure growth is performed immediately before the growth of the second embedding layer. This may reduce the impact of a lattice mismatch from the seed layer.

Methods according to embodiments of the invention may enable the fabrication of scaled single photon detectors or emitters.

FIGS. 1*a*-1*j* show enlarged top views of initial, intermediate and final structures formed during the stages of fabrication methods according to embodiments of the invention, wherein FIGS. 1*a*-1*f* show the preparation of a cavity and FIGS. 1*g*-1*j* the growth of semiconductor material within the cavity.

FIGS. 2*a*-2*j* show corresponding enlarged cross-sectional views of the structures corresponding to the FIGS. 1*a*-1*j*.

Figures 1A, 1B, 1C, 1D, 1E:
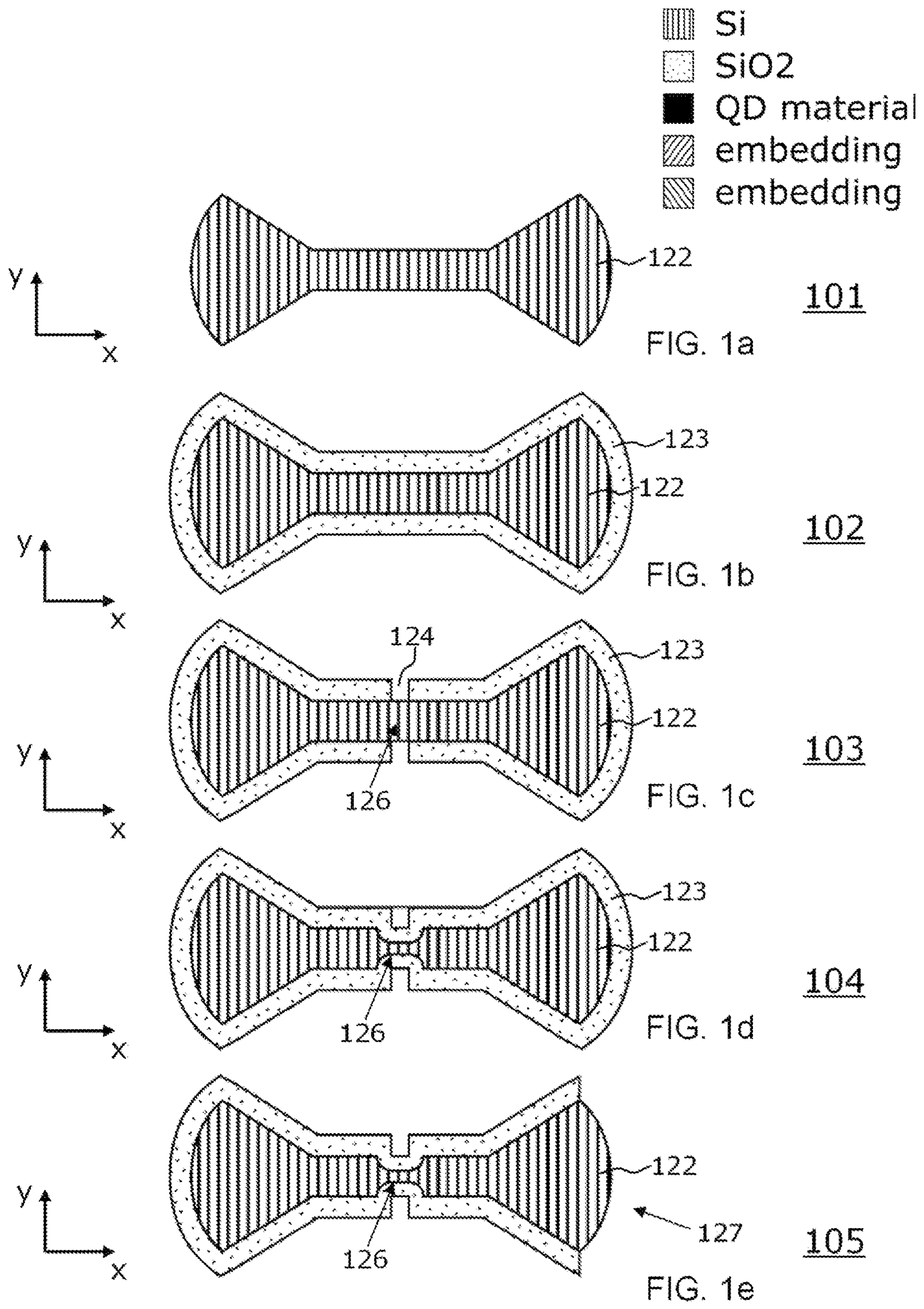
FIGS. 1*a*-1*j* show enlarged top views of initial, intermediate and final structures formed during the stages of fabrication methods according to embodiments of the invention.

FIG. 1*a* illustrates a top view of an initial structure 101 and FIG. 2*a* illustrates a corresponding cross-sectional view. The initial structure 101 includes a substrate 120. The substrate 120 includes a semiconductor material and may be e.g. a bulk semiconductor substrate. The substrate 120 may be embodied as a crystalline semiconductor or a compound semiconductor wafer of a large diameter. The substrate may include, for example, a material from group IV of the periodic table as semiconductor material. Materials of group IV include, for example, silicon, germanium, mixed silicon and germanium, mixed silicon and carbon, mixed silicon germanium and carbon, and the like. For example, the substrate 120 may be a crystalline silicon wafer that is used in the semiconductor industry. For the following exemplary description, it is assumed that the substrate includes Si, which is illustrated by vertical stripes.

The structure 101 further includes an insulating layer 121 on the substrate 120. The insulating layer 121 may be embodied e.g. as a dielectric layer. The insulating layer 121 can be formed by known methods, as for example thermal oxidation, chemical vapor deposition (CVD), plasma enhanced CVD (PECVD), atomic layer deposition (ALD), chemical solution deposition, metal organic chemical vapor deposition (MOCVD), evaporation, sputtering and other deposition processes. Examples of such dielectric material include, but are not limited to: SiO2, Si3N4, A12O3, AlON, Ta2O5, TiO2, La2O3, SrTiO3, LaAlO3, ZrO2, Y2O3, Gd2O3, MgO, MgNO, Hf-based materials and combinations including multilayers thereof.

For the following exemplary description, it is assumed that the insulating layer 121 includes SiO2 which is illustrated by a dotted pattern.

The structure 101 further includes a sacrificial structure 122 on the insulating layer 121. The sacrificial structure 122 includes or consists of a seed material. The seed material may be a group-IV or group-III-V material. The seed material may be in particular Si which is again illustrated in an exemplary way by vertical stripes. According to other embodiments the seed material may be a group-III-V compound material containing gallium (Ga) or indium (In).

The thicknesses of the substrate 120, the insulating layer 121 and the sacrificial structure 122 can be any suitable thicknesses. According to embodiments, the substrate 120 and the sacrificial structure 122 may consist of Si. The insulating layer 121 may consist of SiO2.

According to embodiments, the structure 101 including the substrate 120, the insulating layer 121, and the sacrificial structure 122 may be in particular embodied as a silicon-on-insulator wafer, in particular as a commercial SOI-wafer.

The sacrificial structure 122 has been patterned in a desired way. The sacrificial structure 122 forms the inner part of a cavity structure to be formed subsequently and will be replaced locally by another semiconductor material, in particular a group III-V semiconductor material. The sacrificial structure may be formed by lithography and subsequent etching. The etching may be based in particular on hydrogen bromide (HBr) chemistry, as known in the art and used as standard technique in Si photonics. It has an advantage that it provides smooth sidewalls.

It should be noted that for ease of illustration the top views 1*a*-1*j* do not show the insulating layer 121 and the substrate 120.

FIG. 1*b* illustrates a top view of a structure 102 and FIG. 2*b* a corresponding cross-sectional view. The structure 102 has been formed from the structure 101 by encapsulating the sacrificial structure 122 in oxide. More particularly, the sacrificial structure 122 is covered with a coating layer 123 of a dielectric material. In the exemplary embodiment of FIGS. 1*b* and 2*b* it is assumed that the coating layer 123 includes SiO2 which is illustrated by a dotted pattern.

FIG. 1*c* illustrates a top view of a structure 103 and FIG. 2*c* a corresponding cross-sectional view. The structure 103 has been formed from the structure 102 by forming an opening 124 in the coating layer 123 at the envisaged position of the seed area 126 and the quantum dot structure (to be formed). The opening 124 may be formed in particular by an etching step. According to embodiments the etching may include an under-etching to form also an opening 125 below the sacrificial structure 122. The seed area 126 is positioned in a central part of the sacrificial structure 122.

FIG. 1*d* illustrates a top view of a structure 104 and FIG. 2*d* a corresponding cross-sectional view. The structure 104 has been formed from the structure 103 by performing a controlled oxidation of the seed material of the sacrificial structure 122 at the seed area 126. Thereby a controlled reduction of the cross section of the seed area 126 in the lateral y-direction and/or in the vertical z-direction is performed. According to such an embodiment the seed material of the sacrificial structure 122 may be in particular any suitable oxidizing material. According to embodiments, the seed area 126 has a cross sectional area in the y-z-plane between 100 $nm^2$ and 4000 $nm^2$.

FIG. le illustrates a top view of a structure 105 and FIG. 2*e* a corresponding cross-sectional view. The structure 105 has been formed from the structure 104 by opening a first window 127 to the sacrificial structure 122. More particularly, the SiO2 of the coating layer 123 has been etched, e.g. by reactive ion etching (RIE), to give access to the sacrificial Si material.

Figures 1F, 1G, 1H, 1I, 1J:
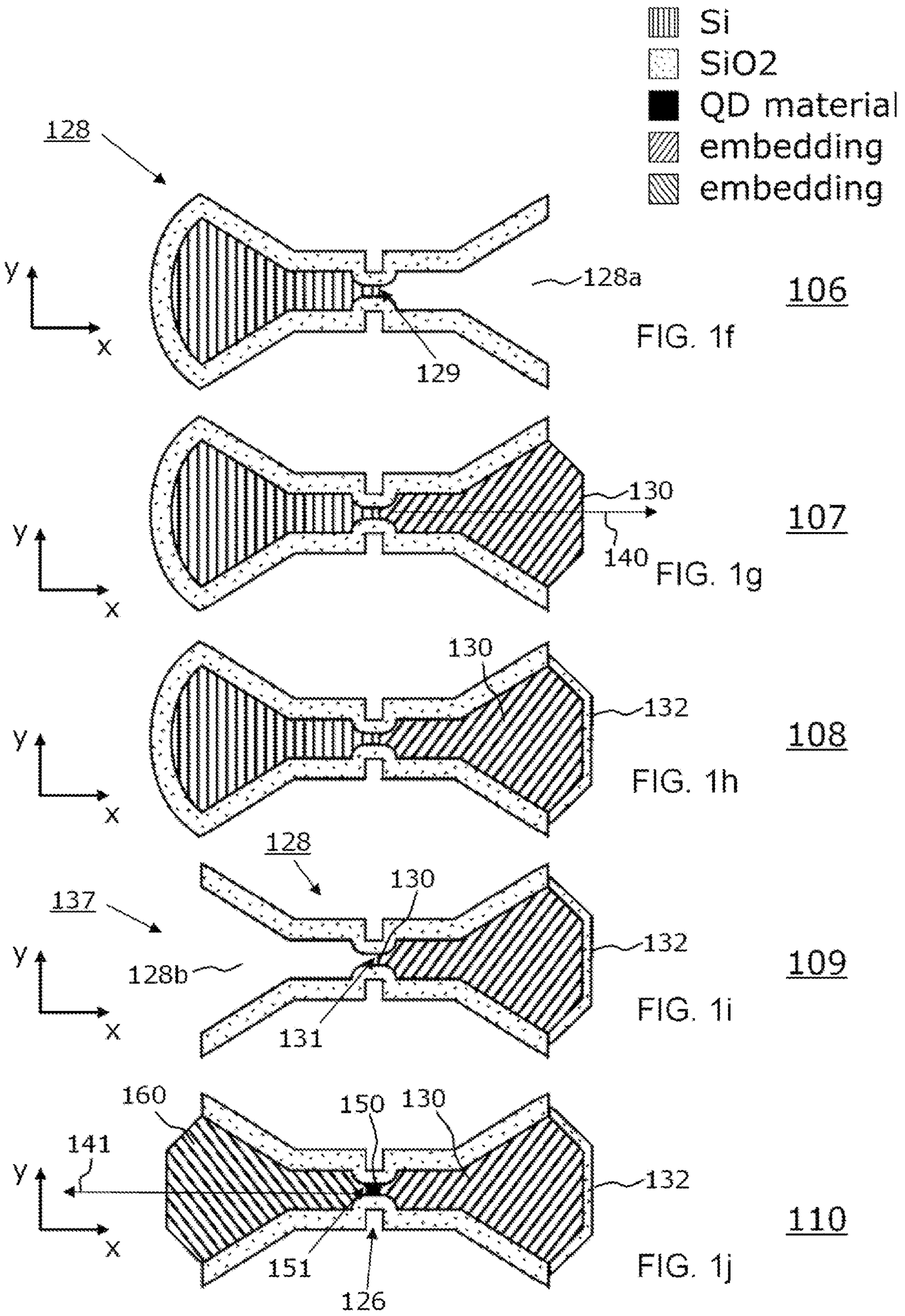

FIG. 1*f* illustrates a top view of a structure 106 and FIG. 2*f* a corresponding cross-sectional view. The structure 106 has been formed from the structure 105 by performing a selective removal of the seed material, in particular the Si, back to the desired position of the quantum dot structure. This has formed a first hollow cavity 128*a* of a cavity structure 128 for a subsequent growth step. The selective removal may be performed in particular by a selective etching technique, such as TMAH or $XeF_2$ based etchants for Si material. The first hollow cavity 128*a* includes a seed surface 129 of the seed material within the seed area 126.

FIG. 1*g* illustrates a top view of a structure 107 and FIG. 2*g* a corresponding cross-sectional view. The structure 107 has been formed from the structure 106 by growing within the cavity structure 128, more particularly within the first cavity 128*a*, a first embedding layer 130 from the seed surface 129. The growing of the first embedding layer 130 is performed in a first growth direction 140. The first growth direction 140 may be in particular a lateral direction.

FIG. 1*h* illustrates a top view of a structure 108 and FIG. 2*h* a corresponding cross-sectional view. The structure 108 has been formed from the structure 107 by encapsulating the first embedding layer 130 with a coating layer 132, in particular an oxide layer. The coating layer 132 may be thinner than the coating layer 123 of the cavity structure 128.

FIG. 1*i* illustrates a top view of a structure 109 and FIG. 2*i* a corresponding cross-sectional view. The structure 109 has been formed from the structure 108 by opening a second window 137 to the sacrificial structure 122. More particularly, the SiO2 of the coating layer 123 is etched by RIE, to give access to the sacrificial Si material. Furthermore, a selective removal of the seed material, in particular the Si, back to the first embedding layer 130, i.e. to the previous nucleation, has been performed. This has formed a second hollow cavity 128*b* of the cavity structure 128 for a subsequent growth step. The selective removal may be performed in particular by a selective etching technique.

The selective etching has formed a seed surface 131 of the first embedding layer 130. In other words, the sacrificial Si material is selectively removed back to the position of the previous nucleation.

FIG. 1*j* illustrates a top view of a structure 110 and FIG. 2*j* a corresponding cross-sectional view. The structure 110 has been formed from the structure 109 by growing in a second growth direction 141 within the cavity structure 128, more particularly within the second cavity 128*b*, from the seed surface 131 of the first embedding layer 130 a quantum dot structure 150. The quantum dot structure 150 has been grown in particular in the seed area 126. In addition, a second embedding layer 160 has been grown in the second growth direction 141 within the cavity structure 128 on a surface 151 of the quantum dot structure 150. The growing of the quantum dot structure 150 and the second embedding layer 160 establishes a second growth step. The second growth step includes a nucleation phase, a growth of the quantum dot structure 150 and a subsequent growth of the second embedding layer 160. Hence two consecutive semiconductor layers have been grown within the cavity structure: first, the quantum dot structure 150 and second, the second embedding layer 160.

The quantum dot structure 150 may be embodied in particular as single quantum dot. Hence according to such an embodiment, the quantum dot structure 150 is grown from a surface of the first embedding layer 130 after the seed layer has been removed, directly preceding and in the same direction as the growth of the second embedding layer 160.

The precise control of the location of a quantum dot is crucial to enable the controlled fabrication of devices. This method enables a self-aligned placement of a single quantum dot inside an active device structure with a two-step growth process.

The growth of the quantum dot structure 150 in a second growth step ensures a high material quality because the quantum dot structure growth nucleates on the first embedding material of the first embedding layer 130. The materials of the first embedding layer 130 and the quantum dot structure 150 can be advantageously chosen to have a small lattice mismatch.

Moreover, the control of the cavity shape, the location of the quantum dot structure 150 therein, and the growth method enable a precise control of the number of QDs in the device.

Accordingly, method according to embodiments of the invention allow a self-aligned device fabrication in particular to Si passives.

As mentioned above, the growing of the quantum dot structure 150 and of the second embedding layer 160 is performed in a second growth direction 141. The first growth direction 140 and the second growth direction 141 are in particular lateral directions in the y-x-plane. The first growth direction 140 is in particular the opposite direction to the second growth direction 141.

The seed surface 131 of the first embedding layer 130 and the surface 151 of the quantum dot structure 150 are arranged at opposite sides of the quantum dot structure 150. Accordingly, the first embedding layer 130 and the second embedding layer 160 are arranged at opposite sides of the quantum dot structure 150.

According to embodiments, the dimensions of the quantum dot structure 150 may be in a range between 10 nm and 60 nm in all dimensions, i.e. in the x-direction, the y-direction and the z-direction.

The quantum dot structure 150 may include in particular a group III-V semiconductor material. The first embedding layer 130 and the second embedding layer 160 may include in particular a group III-V semiconductor material as well.

According to embodiments, the quantum dot structure 150 may include a second semiconductor material, in particular a second group III-V semiconductor material, while the first and the second embedding layers 130, 160 may include a first semiconductor material, in particular a first group III-V semiconductor material. The first semiconductor material and the second semiconductor material may have a different bandgap to provide quantum confinement. In particular, the first semiconductor material of the first and the second embedding layers 130, 160 may have a larger bandgap than the second semiconductor material of the quantum dot structure 150. One preferred combination of the first and the second group III-V semiconductor materials include InP as first semiconductor material of the embedding layers 130, 160 and InGaAs as second semiconductor material of the quantum dot structure 150. Other preferred combinations encompass AlGaAs combined with GaAs and GaAs combined with InGaAs.

According to embodiments, the first embedding layer 130 may include a first semiconductor material and the second embedding layer 160 a third semiconductor material which is different from the first semiconductor material.

However, it should be noted that the group III-V materials may be generally binary as well as ternary or quaternary materials.

According to other embodiments, appropriate pairs of group II-VI semiconductor compounds, mixed II-VI compounds, and IV-IV compounds may be used.

According to embodiments, the quantum dot structure 150 may include a second semiconductor material, the first embedding layer 130 may include a doped semiconductor layer of a first semiconductor material and the second embedding layer 160 may include a doped semiconductor layer of the first semiconductor material or of a third semiconductor material.

According to embodiments the pairs first semiconductor material/second semiconductor material may be established in particular by the pairs InP/InGaAs; InP/InAlGaAs; GaAs/AlGaAs; GaAs/InAs; InP/InAsSb; GaN/InGaN or InAs/CdSe.

The growing of the first embedding layer 130, the growing of the quantum dot structure 150 and the growing of the second embedding layer 160 may be performed e.g. by MOCVD, by atmospheric pressure CVD, by low or reduced pressure CVD, by ultra-high vacuum CVD, by molecular beam epitaxy (MBE), by ALD or by hydride vapor phase epitaxy.

In general, the versatility of methods according to embodiments of the invention may allow any combination of group III-V semiconductor materials in the cavity structure 128, including embedded quantum wells, quantum dots, quantum wires, doped or intrinsic semiconductor layers as well as heterojunctions.

According to embodiments the quantum dot structure 150, the first embedding layer 130 and the second embedding layer 160 may form a gain structure. Such a gain structure has been epitaxially grown and extends in a lateral direction of the substrate, more particularly in the x-y-plane. The x-y-plane is arranged in parallel to the underlying substrate.

Hence the embodied gain structure may include a doping profile which forms a p-i-n-structure. This may facilitate electrical pumping. A p-i-n-structure is a structure having an intrinsic region arranged between a p-doped region and a n-doped region.

In this respect, doping shall be understood as the intentional introduction of impurities into an intrinsic semiconductor for the purpose of modulating its electrical and optical and structural properties. Doping a semiconductor introduces allowed energy states within the band gap, but very close to the energy band that corresponds to the dopant type. Positive or p-type doping introduces free holes in the valence band, whereas negative or n-type doping introduces free electrons within the conduction band.

The introduction of dopants has the effect of shifting the energy bands relative to the Fermi level. In a n-type semiconductor the Fermi level is close to the conduction band, or within the conductance band in a degenerate n-type semiconductor. For p-type the Fermi level is close to the or within the valance band. Doping densities in typically doped semiconductors range from $5\times10^{18}$ $cm^3$ to $10^{20}$ $cm^3$, depending on the material and density of states. Whereas semiconductors are rarely perfectly intrinsic, intrinsic in the electrical sense means that they are not conductive. Typically, the doping level is around $10^{15}$-$10^{16}$ $cm^3$.

FIG. 3 shows a flow chart of method steps of a method for fabricating a semiconductor structure according to embodiments of the invention.

At a step 310, a cavity structure is provided. The cavity structure includes a seed area including a seed material.

At a step 320, a first embedding layer is grown within the cavity structure in a first growth direction from a seed surface of the seed material.

At a step 330, the seed material of the sacrificial structure is removed.

At a step 340, a quantum dot structure is grown in a second growth direction from a seed surface of the first embedding layer.

At a step 350, growing, within the cavity structure, on a surface of the quantum dot structure, a second embedding layer in the second growth direction.

The second growth direction is different from the first growth direction and may be in particular opposite to the first growth direction.

It should be noted that the steps 320 and/or 350 may be followed by further processing steps as appropriate to derive at a final device structure as desired. This may include in particular a step of growing contact layers on the embedding layers. According to embodiments, a contact layer for the first embedding layer may be grown already directly after the growth of the first embedding layer.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures may be preferably crystalline seed surfaces, but may according to other embodiments also be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline, but its crystal orientation will be random.

According to embodiments, the first embedding layer and/or the second embedding layer may contain heterostructures or a variation of the (material) composition of the respective layer along the first and/or the second growth direction respectively. This may boost the electrical performance.

The disclosed semiconductor structures and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip may be integrated with other chips, discrete circuit elements, and/or other signal processing devices as part of either an intermediate product, such as a motherboard, or an end product. The end product can be any product that includes integrated circuit chips.

The following definitions and abbreviations are to be used for the interpretation of the claims and the specification. As used herein, the terms “comprises,” “comprising,” “includes,” “including,” “has,” “having,” “contains” or “containing,” or any other variation thereof, are intended to cover a non-exclusive inclusion. For example, a composition, a mixture, process, method, article, or apparatus that includes a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the term "quantum dot structure" is a non-limiting term and shall refer to quantum well embodiments, quantum dots, in particular single quantum dots, and quantum wires.

As used herein, the terms "invention" or "present invention" are non-limiting terms and not intended to refer to any single aspect of the particular invention but encompass all possible aspects as described in the specification and the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, the semiconductor device comprising:

a first embedding layer;

a second embedding layer, wherein the second embedding layer is located laterally adjacent to the first embedding layer, wherein the second embedding layer comprises a lattice mismatch to the first embedding layer; and a quantum dot structure between the first embedding layer and the second embedding layer, wherein the first embedding layer and the second embedding layer are located on opposite sides of the quantum dot structure.

2. The semiconductor device according to claim 1, wherein a lateral thickness of a second coating layer on a vertical side surface of the first embedding layer is less than a vertical thickness of a first coating layer on an upper horizontal surface of the first embedding layer.

3. The semiconductor device according to claim 1, wherein the first embedding layer comprises a doped semiconductor layer of a first semiconductor material, the second embedding layer comprises a doped semiconductor layer of the first semiconductor material, and the quantum dot structure comprises a second semiconductor material.

4. The semiconductor device according to claim 1, wherein the first embedding layer comprises a doped semiconductor layer of a first semiconductor material, the second embedding layer comprises a doped semiconductor layer of a third semiconductor material, and the quantum dot structure comprises a second semiconductor material.

5. The semiconductor device according to claim 4, wherein the first semiconductor material and the third semiconductor material each have a larger bandgap than the second semiconductor material.

6. The semiconductor device according to claim 3, wherein the first semiconductor material and the second semiconductor material are selected from pairs consisting of: InP/InGaAs; InP/InAlGaAs; GaAs/AlGaAs; GaAs/InAs; InP/InAsSb; GaN/InGaN; and InAs/CdSe.

7. The semiconductor device according to claim 1, wherein the first embedding layer and the second embedding layer form an intrinsic region arranged between a p-doped region and an n-doped region.

8. The semiconductor device according to claim 1, wherein the first embedding layer comprises a heterostructure along a first growth direction and/or a second growth direction respectively, and the second embedding layer comprises a heterostructure along the second growth direction, wherein the first growth direction and the second growth direction are opposite each other.

9. The semiconductor device according to claim 1, wherein the quantum dot structure comprises a cross sectional area between 100 $nm^2$ and 4000 $nm^2$.

10. The semiconductor device according to claim 1, wherein a vertical height of the quantum dot structure is less than a vertical height of the first embedding layer, and the vertical height of the quantum dot structure is less than a vertical height of the second embedding layer.

11. A semiconductor device, the semiconductor device comprising:

a first embedding layer;

a second embedding layer, wherein the second embedding layer is located laterally adjacent to the first embedding layer; and a quantum dot structure between the first embedding layer and the second embedding layer, wherein the second embedding layer comprises a lattice mismatch to the first embedding layer, wherein the first embedding layer and the second embedding layer are located on opposite sides of the quantum dot structure.

12. The semiconductor device according to claim 11, wherein a lateral thickness of a second coating layer on a vertical side surface of the first embedding layer is less than a vertical thickness of a first coating layer on an upper horizontal surface of the first embedding layer.

13. The semiconductor device according to claim 11, wherein the first embedding layer comprises a doped semiconductor layer of a first semiconductor material, the second embedding layer comprises a doped semiconductor layer of the first semiconductor material, and the quantum dot structure comprises a second semiconductor material.

14. The semiconductor device according to claim 11, wherein the first embedding layer comprises a doped semiconductor layer of a first semiconductor material, the second embedding layer comprises a doped semiconductor layer of a third semiconductor material, and the quantum dot structure comprises a second semiconductor material.

15. The semiconductor device according to claim 14, wherein the first semiconductor material and the third semiconductor material each have a larger bandgap than the second semiconductor material.

16. The semiconductor device according to claim 11, wherein the first embedding layer and the second embedding layer form an intrinsic region arranged between a p-doped region and an n-doped region.

17. A semiconductor device, the semiconductor device comprising:

a first embedding layer that is comprised of a doped semiconductor layer of a first semiconductor material;

a second embedding layer that is comprised of a doped semiconductor layer of a third semiconductor material, wherein the second embedding layer is located laterally adjacent to the first embedding layer; and a quantum dot structure between the first embedding layer and the second embedding layer, wherein the quantum dot structure is comprised of a second semiconductor material, wherein the first embedding layer and the second embedding layer form an intrinsic region arranged between a p-doped region and an n-doped region, wherein the first embedding layer and the second embedding layer are located on opposite sides of the quantum dot structure.

18. The semiconductor device according to claim 17, wherein the first semiconductor material and the third semiconductor material each have a larger bandgap than the second semiconductor material.

* * * * *